(12) United States Patent
Nishio et al.

(10) Patent No.: US 8,687,330 B2
(45) Date of Patent: Apr. 1, 2014

(54) SEMICONDUCTOR DEVICE (75) Inventors: Minoru Nishio, Matsumoto (JP); Takatoshi Oe, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 99 days.

(21) Appl. No.: 13/515,183

(22) PCT Filed: Sep. 5, 2011

(86) PCT No.: PCT/JP2011/070101
§ 371 (c)(1),
(2), (4) Date: Jun. 11, 2012

(87) PCT Pub. No.: WO2012/043146
PCT Pub. Date: Apr. 5, 2012

(65) Prior Publication Data
US 2012/0268851 A1 Oct. 25, 2012

(30) Foreign Application Priority Data
Sep. 28, 2010 (JP) .................. 2010-216971

(51) Int. Cl.
*H02H 9/00* (2006.01)
(52) U.S. Cl.
USPC ........................................ 361/56
(58) Field of Classification Search
USPC ........................................ 361/58
See application file for complete search history.

(56) References Cited

U.S. PATENT DOCUMENTS

| | | | | |
|---|---|---|---|---|
| 5,262,691 A | * | 11/1993 | Bailey et al. | 327/440 |
| 6,731,486 B2 | * | 5/2004 | Holt et al. | 361/91.1 |
| 7,339,361 B2 | * | 3/2008 | Dong et al. | 323/285 |
| 2007/0024370 A1 | | 2/2007 | Hirata et al. | |
| 2007/0104304 A1 | * | 5/2007 | Takahashi | 375/375 |
| 2011/0080151 A1 | * | 4/2011 | Rahardjo et al. | 323/285 |

FOREIGN PATENT DOCUMENTS

| | | |
|---|---|---|
| JP | 05-219752 A | 8/1993 |
| JP | 05-267582 A | 10/1993 |
| JP | 06-152353 A | 5/1994 |
| JP | 2001-197724 A | 7/2001 |
| JP | 2006-353093 A | 12/2006 |
| JP | 2007-036973 A | 2/2007 |
| JP | 2007-104805 A | 4/2007 |
| JP | 2009-060358 A | 3/2009 |

OTHER PUBLICATIONS

International Search Report issued in PCT/JP2011/070101 dated Sep. 27, 2011.

* cited by examiner

*Primary Examiner* — Dharti Patel
(74) *Attorney, Agent, or Firm* — Rossi, Kimms & McDowell LLP (57) ABSTRACT

The invention provides a low cost semiconductor device with which it is possible to easily select IGBT soft shutdown characteristics appropriate to a system.

The drive IC (100) is configured of an output stage circuit (1), a shutdown circuit (2), a logic circuit (3), and an alarm signal processing circuit (4), the shutdown circuit (2) is configured of a resistor circuit (5) and an n-MOSFET (8), and the resistor circuit (5) is formed by an n-MOSFET (9), a resistor (10), and a switching conductor (11). By switching the switching conductor (11) of the resistor circuit (5) among A, B, and C conditions, it is possible to easily select shutdown characteristics of an IGBT (61) appropriate to a system.

10 Claims, 13 Drawing Sheets

SEMICONDUCTOR DEVICE

This application is a U.S. National Phase Application of PCT International Application PCT/JP2011/070101, filed on Sep. 5, 2011, which is based on and claims priority from JP 2010-216971, filed on Sep. 28, 2010. The contents of the documents cited in this paragraph are hereby incorporated herein by reference in their entireties.

TECHNICAL FIELD

The present invention relates to a semiconductor device, such as a drive IC (integrated circuit), that drives a switching element controlling a motor, or the like.

BACKGROUND ART

Frequent use is made of an IGBT (insulated gate bipolar transistor), which is a switching element, as a motor controlling element. When shutting down an IGBT by sharply reducing a gate signal of the IGBT, the main current of the IGBT decreases sharply, and an overvoltage is applied to the IGBT due to inductance of a main circuit. When an overvoltage exceeding the withstand voltage of the IGBT is applied, the IGBT is destroyed.

Figure 10:
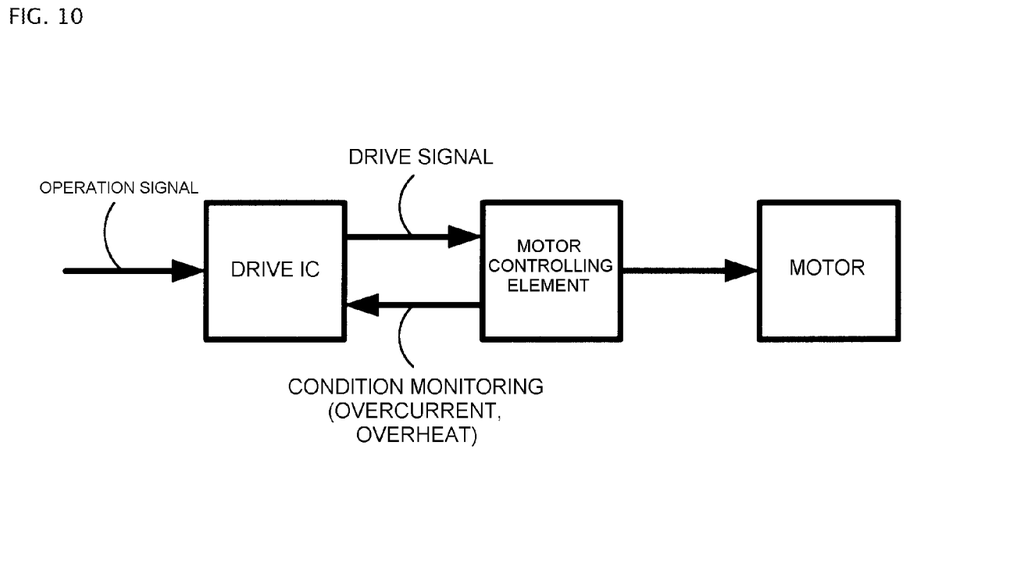
FIG. 10 is a block diagram showing a system when a motor is driven by an IGBT.

FIG. 10 is a block diagram showing a system when a motor is driven by an IGBT. When the IGBT operates abnormally (overcurrent, overheat, or the like), or when an unshown external alarm signal is input, it is required that this is detected, and that the output of the drive IC is shut down, thus stopping the operation of the IGBT. At this time, as the IGBT is destroyed as heretofore described when an abrupt signal shutdown is executed, it is required that a shutdown mode wherein the shutdown signal is gentle (called a soft shutdown) is adopted.

Figure 11:
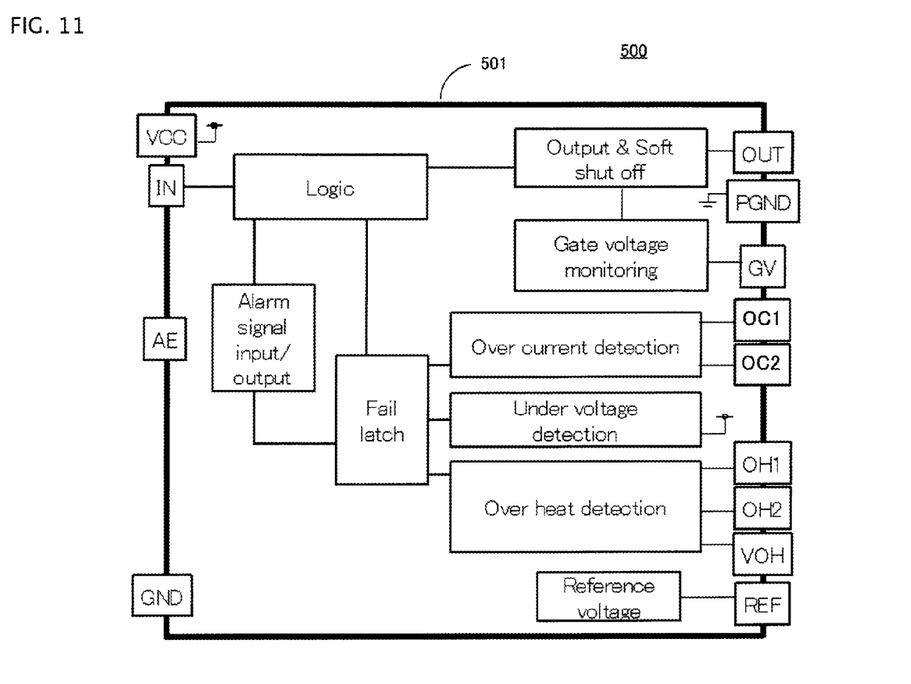
FIG. 11 is a block diagram showing a configuration of a drive IC 500.

FIG. 11 is a block diagram showing a configuration of a drive IC 500. A description will be given of each terminal formed in the drive IC 500. In FIG. 11, IN is an input terminal that receives an operation signal at a time of normal operation, and OUT is an output terminal that outputs a signal for driving a controlling element (IGBT). OC1 and OC2 are terminals that detect an IGBT overcurrent, while OH1 and OH2 are terminals that detect an IGBT overheat. GV is a terminal for monitoring the gate voltage of the IGBT, REF is a reference voltage terminal of each kind of circuit, and VOH is a terminal that determines a reference voltage when an overheat is detected. Also, AE is a terminal that outputs (or inputs) an alarm signal.

Figure 12:
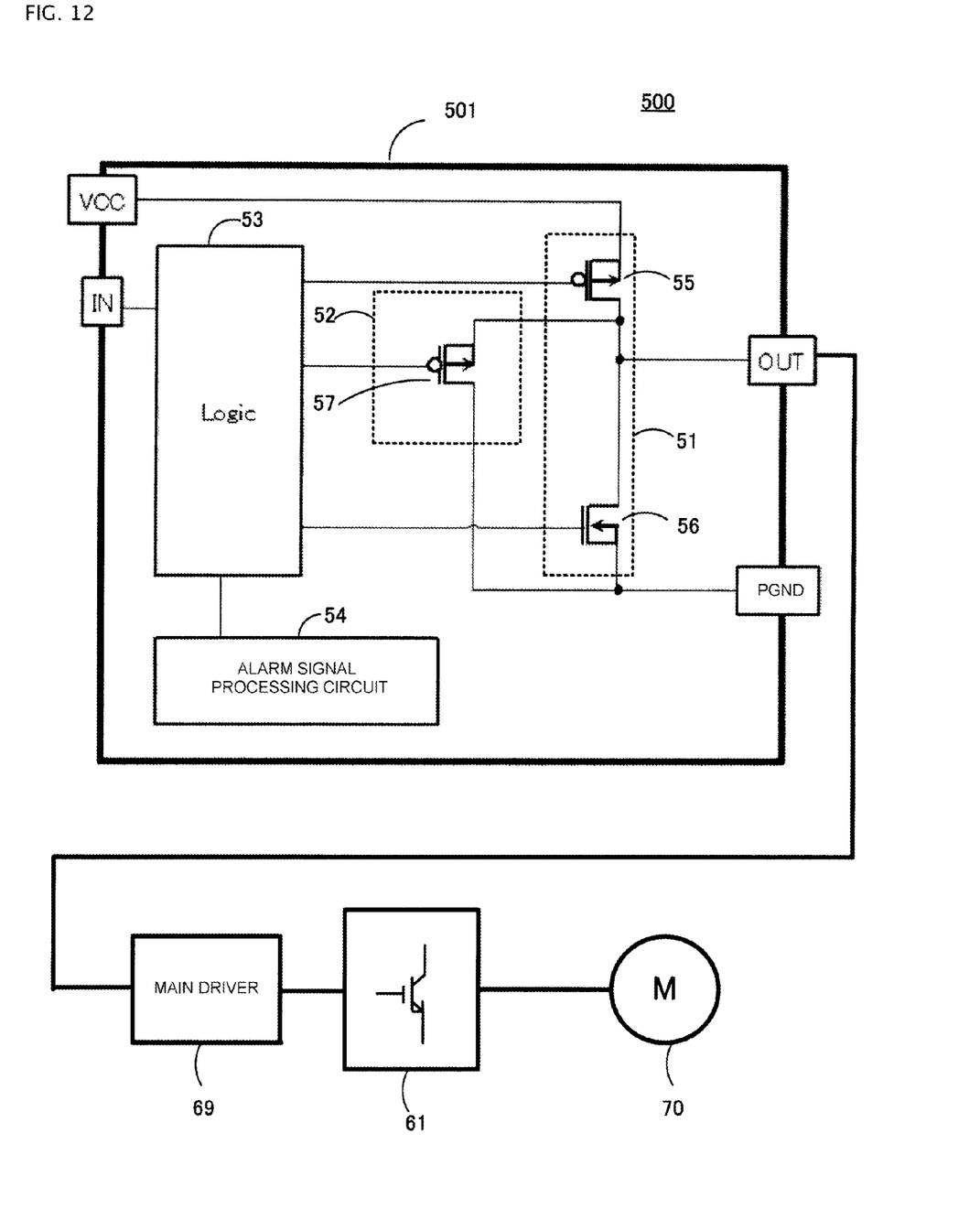
FIG. 12 is a main portion circuit diagram of a heretofore known drive IC and a block diagram of a system including the drive IC, a main driver, an IGBT, and a motor.

FIG. 12 is a diagram showing a main portion circuit diagram of a heretofore known drive IC and a block diagram of a system including the drive IC, a main driver, an IGBT, and a motor. Each terminal, such as VCC, IN, OUT, and PGND, each MOSFET 55, 56, and 57, a logic circuit 53, and an alarm signal processing circuit 54 are formed in a semiconductor substrate 501. Also, the p-MOSFET 57 configures a shutdown circuit 52.

An operation signal is input into the input terminal IN at a time of normal operation, and the operation signal controls a signal output from the output terminal OUT by alternately turning the p-MOSFET (a p-channel type MOSFET) 55 and n-MOSFET (an n-channel type MOSFET) 56 on and off via the logic circuit 53. When the p-MOSFET 55 is turned on, an on signal (H signal) is applied from the output terminal OUT to the gate of the IGBT 61 via the main driver 69. When the p-MOSFET 55 is turned off, and the n-MOSFET 56 is turned on, an off signal (L signal) is applied from the output terminal OUT to the gate of the IGBT 61 via the main driver 69.

At a time of abnormal operation, irrespective of the signal from an unshown control circuit in the logic circuit 53, the p-MOSFET 55 and n-MOSFET 56 are both turned off via the alarm signal processing circuit 54 and logic circuit 53, and an on signal is applied from the logic circuit 53 to the gate of the p-MOSFET 57 configuring the shutdown circuit 52. By so doing, the p-MOSFET 57 is turned on, and the gate voltage of the IGBT 61 is lowered to the ground potential via the output terminal OUT and main driver 69. At this time, a charge accumulated at the gate of the IGBT 61 is drawn along a route from the main driver 69 through the output terminal OUT and p-MOSFET 57 to the ground terminal PGND (to be exact, the p-MOSFET 57 draws current from the input portion of the main driver 69, and the main driver 69 amplifies the action of the input portion, thus drawing the charge accumulated at the gate of the IGBT 61. In this case, the main driver functions as one kind of current amplifier). As the shutdown circuit 52, that is, the p-MOSFET 57, is designed so as to turn on gently (has soft shutdown characteristics), the charge accumulated at the gate of the IGBT 61 is drawn gently, and the IGBT 61 shuts down softly.

Figure 13:
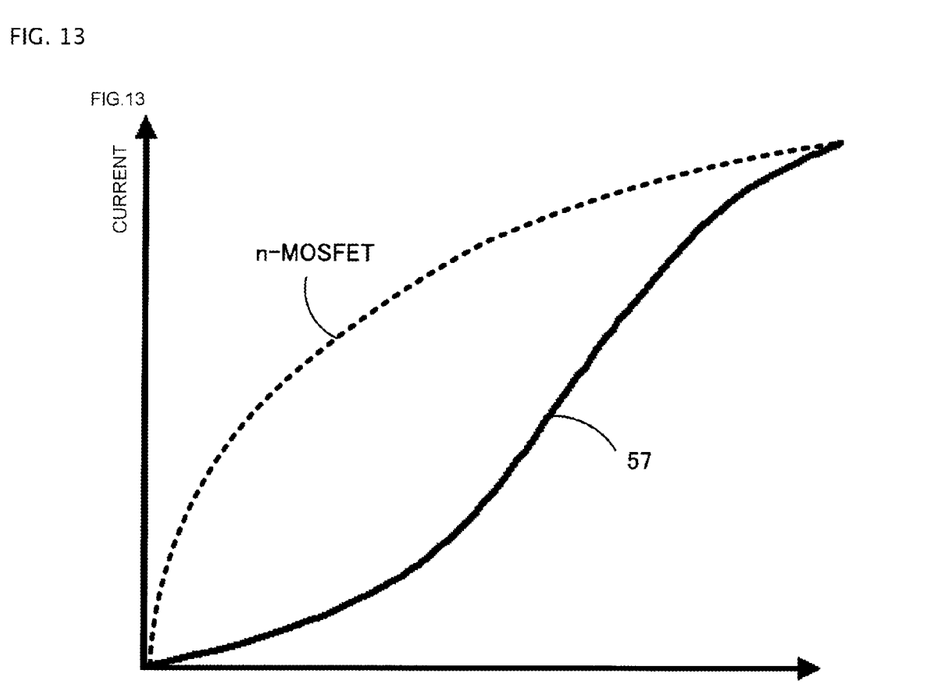
FIG. 13 is a diagram of voltage-current characteristics of the output terminal OUT at a time of abnormal operation.

FIG. 13 is a diagram showing voltage-current characteristics of the output terminal OUT at a time of abnormal operation. The voltage on the horizontal axis, being the voltage of the output terminal OUT, is the voltage between the source and drain of the p-MOSFET 57. Also, the vertical axis, being the current of the output terminal OUT, is the source current the p-MOSFET 57. The voltage-current characteristics of the output terminal OUT are such that, in accordance with the output characteristics of the shutdown circuit 52, that is, the p-MOSFET 57, an increase in current in a region of low voltage is gentle, and the rise in current becomes somewhat steep when the voltage is moderately high (depending on the characteristics of the diode connected p-MOSFET 57). As the current increases, and the resistance between the source and drain of the p-MOSFET 57 becomes dominant, in a region in which the voltage is higher still, the p-MOSFET 57 is designed so as to have soft shutdown characteristics such that the current becomes gentle again.

In a system mounted in a vehicle such as an automobile, a battery voltage (VB), which is a power source, is normally 10 to 20V. The power source terminal (VCC terminal) of the drive IC 500 is connected to VB, meaning that, when using a source follower type of p-channel type MOSFET like the p-MOSFET 57, a voltage of 0V to VB (the battery voltage) is necessary as a gate input signal of the p-MOSFET 57.

The heretofore described voltage-current characteristics of the output terminal OUT at a time of abnormal operation are primarily determined by the design of the p-MOSFET 57 configuring the shutdown circuit 52. Herein, an example is given of a case wherein the p-MOSFET 57 is designed in such a way that the increase in current in a low voltage region is small, the increase in current becomes larger as the voltage is raised, and the increase in current becomes gentle again when the voltage becomes higher still. The dotted line represents voltage-current characteristics when the shutdown circuit 52 is configured of an n-MOSFET instead of a p-MOSFET. Characteristics are shown such that the current increases sharply in a low voltage region, and the current is saturated as the voltage rises. Soft shutdown characteristics cannot be obtained with these n-MOSFET voltage-current characteristics. However, as there is an advantage in that the drive voltage is low, and the like, there are cases in which an n-MOSFET is used in a system.

Figure 14:
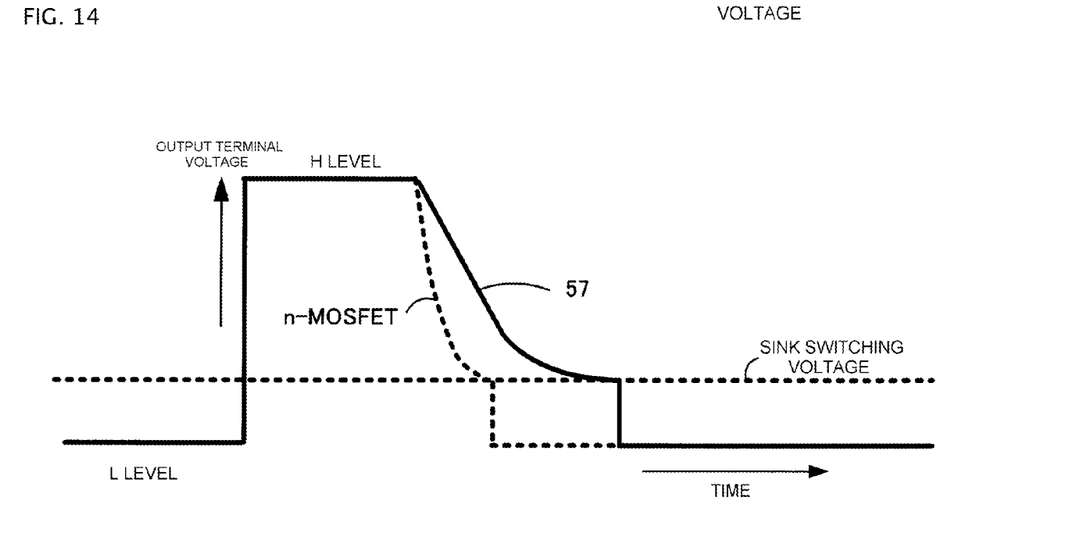
FIG. 14 is a diagram of output terminal OUT voltage waveforms at a time of abnormal operation.

FIG. 14 is a diagram of output terminal OUT voltage waveforms at a time of abnormal operation. In the waveform diagram in the case of the p-MOSFET 57 shown by the solid line, the fall of the voltage is gentle, while in the waveform diagram in the case of the n-MOSFET shown by the dotted line, the fall of the voltage is abrupt. Also, when the voltage of the output terminal OUT becomes sufficiently low, reaching a sink switching voltage, the n-MOSFET 56 is turned on, and the voltage of the output terminal OUT becomes the potential of the ground terminal PGND. The sink switching voltage is a voltage that switches the on condition from the p-MOSFET 55 or p-MOSFET 57 (source side) to the n-MOSFET 56 (sink side).

Figure 15:
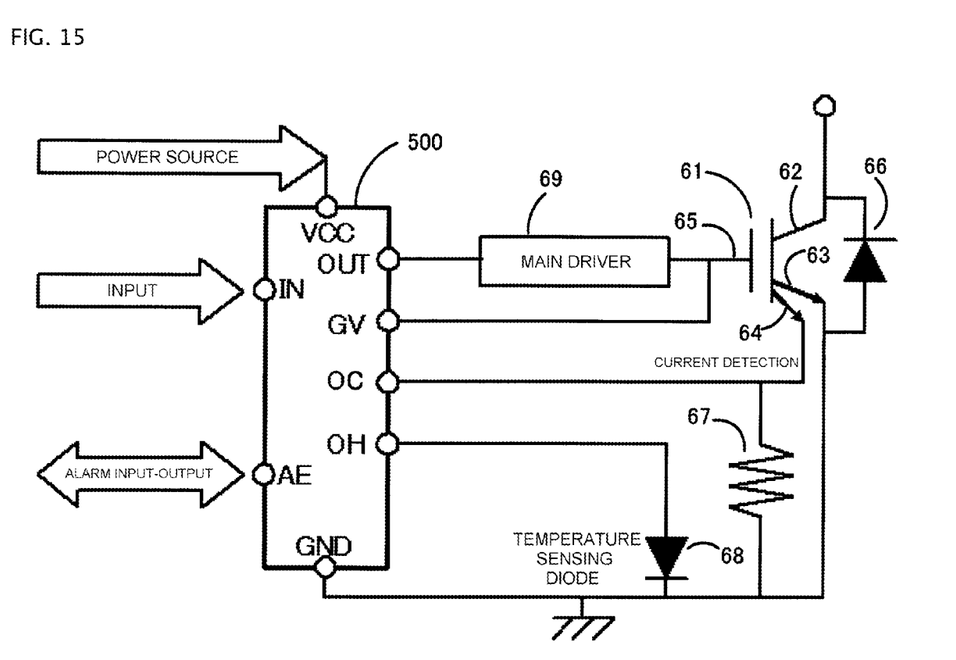
FIG. 15 is a main portion configuration diagram of a heretofore known system.

FIG. 15 is a main portion configuration diagram of a heretofore known system. An FWD 66 (freewheel diode) is connected to the IGBT 61, and a current detecting resistor 67 is connected to an IGBT 61 current sensing (detecting) emitter 64. Although not shown, there is also a method of detecting current by detecting the voltage between the emitter and collector of the IGBT 61. Also, a p-n diode 68 for temperature sensing is connected adjacent to the IGBT 61. The drive IC 500 includes the power source terminal VCC, the output terminal OUT, the gate voltage monitoring terminal GV, the overcurrent monitoring terminal OC, the overheat monitoring terminal OH, a ground terminal GND, the alarm terminal AE, and the input terminal IN. The output terminal OUT is connected to the input of the main driver 69, and the output of the main driver 69 is connected to the gate of the IGBT 61. The gate of the IGBT 61 is connected to the gate voltage monitoring terminal GV. The current sensing emitter 64 is connected to the current detecting resistor 67, and the high potential side of the resistor 67 is connected to the overcurrent terminal OC. The anode of the temperature sensing p-n diode 68 is connected to the overheat monitoring terminal OH, and the cathode is connected to the ground terminal GND. The battery voltage VB is input into the power source terminal VCC, an input signal is input into the input terminal IN, and an alarm input-output signal is input into and output from the alarm terminal AE.

Depending on the system, there are cases in which the output terminal OUT of the drive IC 500 and the gate of the driven IGBT 61 are directly connected, without passing through the main driver 69. Also, temperature sensing is carried out by the forward voltage of the p-n diode 68. Also, an operation signal from the exterior is input into the input terminal IN.

FIG. 16 to FIG. 19 are timing chart diagrams of various kinds of operation of the drive IC 500.

Figure 16:
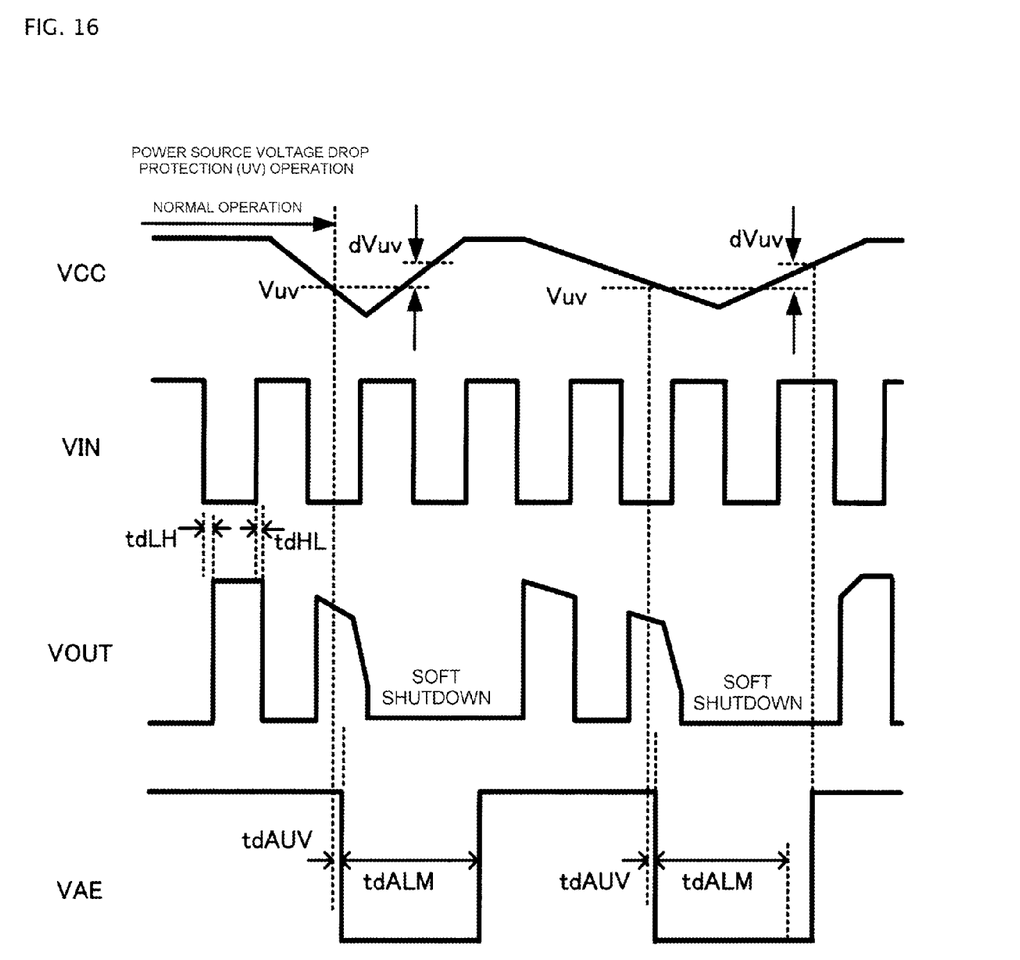
FIG. 16 is a timing chart diagram of a power source voltage (VCC) drop protection operation.

(1) Regular On-off Operation (Normal Operation: FIG. 16)

When the input terminal IN signal changes from an H level (OFF) to an L level (ON), the output terminal OUT signal changes from an L level (OFF) to an H level (ON), and the IGBT is turned on. At this time, the alarm terminal AE is at an H level (non-alarm condition).

Figure 17:
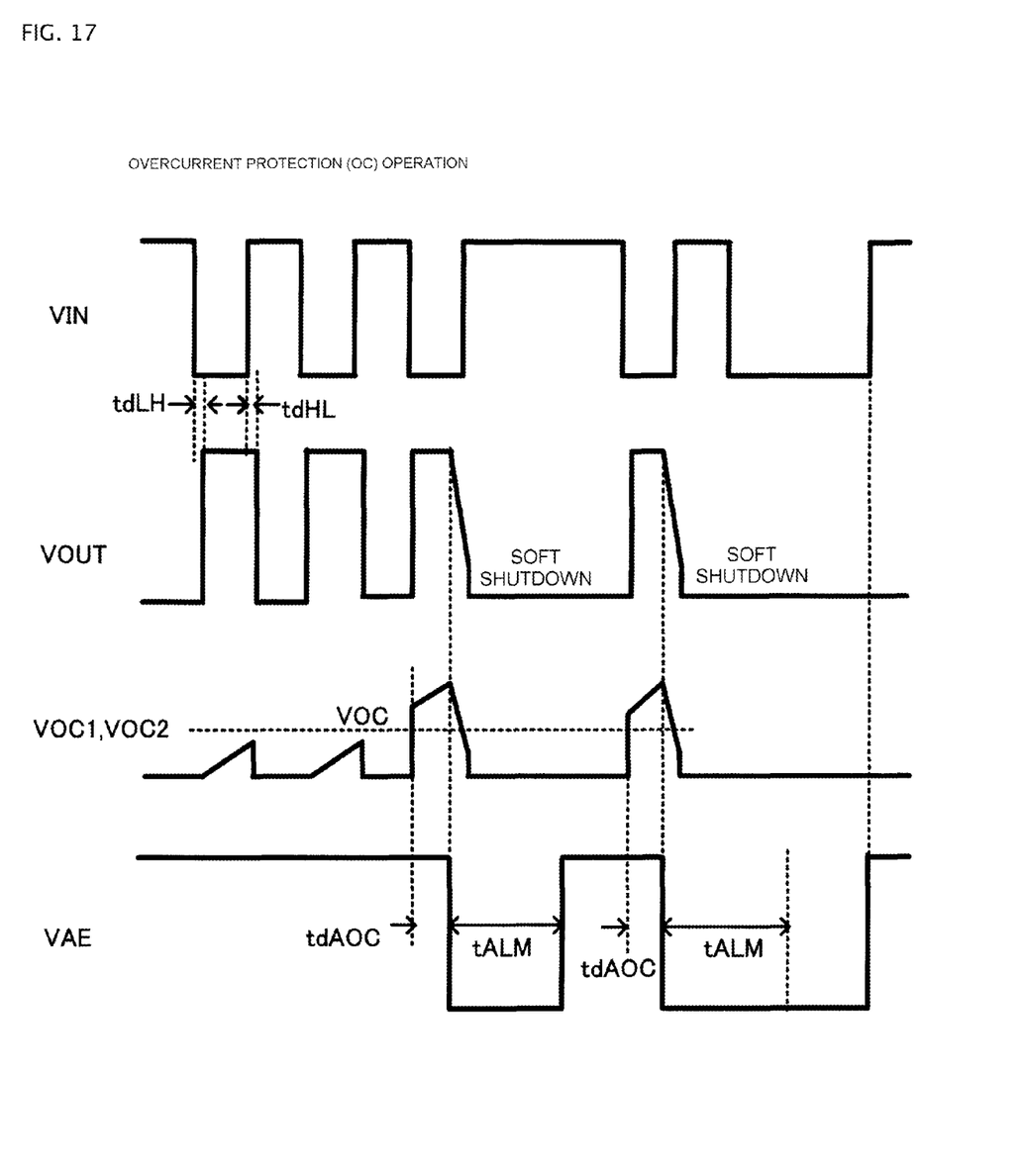
FIG. 17 is a timing chart diagram of an overcurrent (OC) protection operation.
Figure 18:
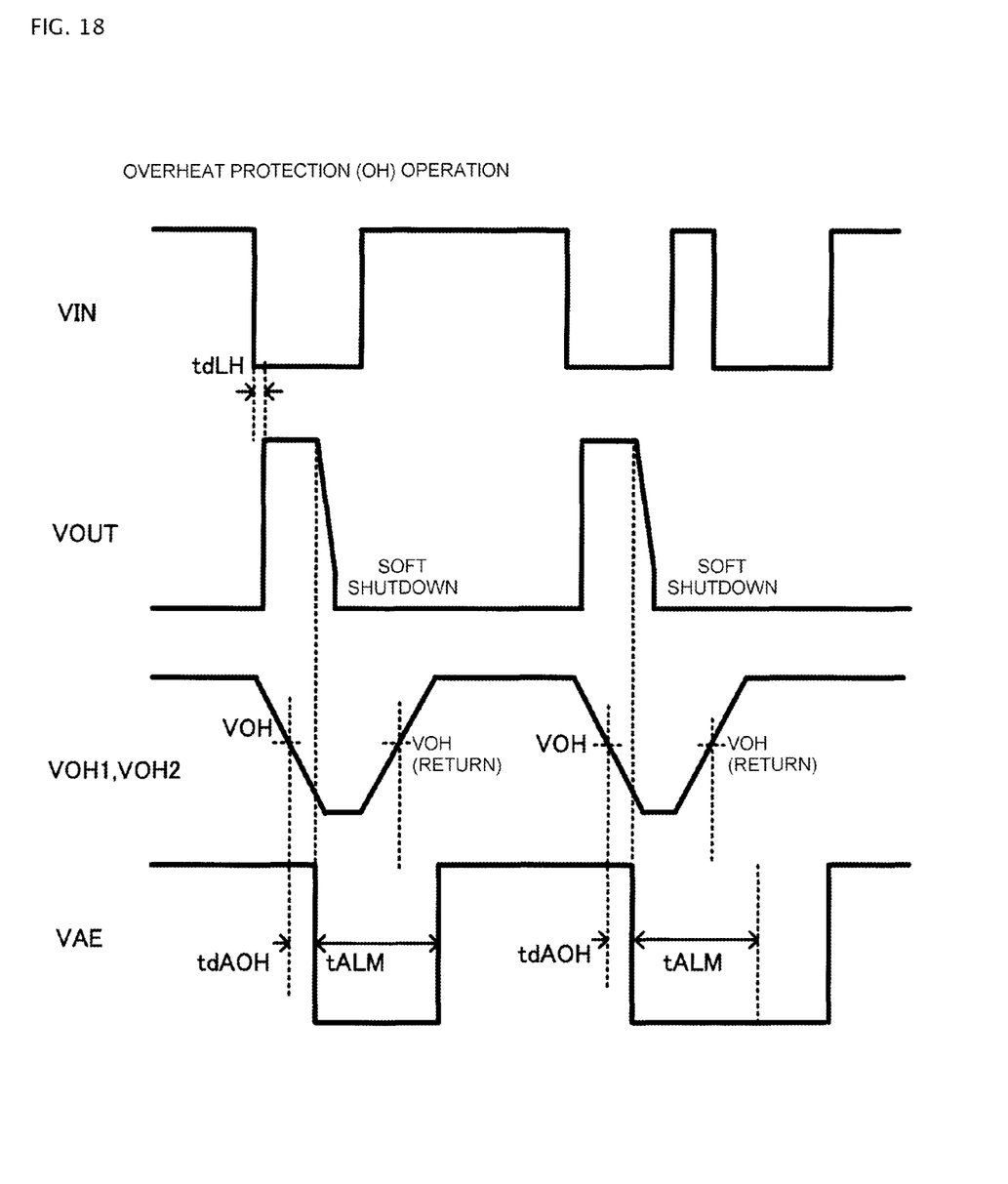
FIG. 18 is a timing chart diagram of an overheat (OH) protection operation.

(2) Power Source Voltage (VCC) Drop, Overcurrent, and Overheat Protection Operations (FIG. 16, FIG. 17, and FIG. 18)

On any kind of protection signal reaching a set voltage when the input terminal IN signal is at the L level (ON), the output terminal OUT signal changes from the H level (ON) to the L level (OFF). In the event of an abrupt change to the L level (OFF) when the output terminal OUT signal changes from the H level (ON) to the L level (OFF), the current flowing through the IGBT 61 also changes sharply. When this happens, an excessive surge voltage is generated by the inductance (floating inductance, or the like) of an external circuit, and there is a possibility of the IGBT 61 being destroyed due to overvoltage. Because of this, the output terminal OUT signal is changed to the L level (OFF) softly. The voltage of the output terminal OUT is monitored by the gate voltage monitoring terminal GV, and on the voltage (sink switching voltage) of the output terminal OUT dropping until a large current ceases to flow through the IGBT 61, the voltage of the OUT terminal is changed absolutely to the L level (GND) at that point, and the IGBT is turned off.

Also, on any kind of protection signal reaching the set voltage, the alarm terminal AE signal is changed from the H level (non-alarm condition) to an L level (alarm condition). The L level is maintained for a set certain period. Then, after the certain period, the alarm terminal AE signal changes from the L level (alarm condition) to the H level (non-alarm condition). When there is a protection detection condition, and the input terminal signal is at the L level (ON), after the certain period, the alarm condition continues until these conditions are eliminated.

Although not shown, the two functions of power source voltage drop and overheat protection are such that, on either kind of protection signal reaching the set voltage even when the input terminal IN signal is at the H level (OFF), the alarm terminal AE signal is changed from the H level (non-alarm condition) to the L level (alarm condition), and the L level is maintained for the set certain period. Even in the event that the input terminal IN signal changes to the L level (ON) condition within the certain time for which the L level is maintained, the output terminal OUT signal does not change to the H level (ON). When there is a protection detection condition, and the input terminal signal is at the L level (ON), after the certain period, the alarm condition continues until these conditions are eliminated.

Figure 19:
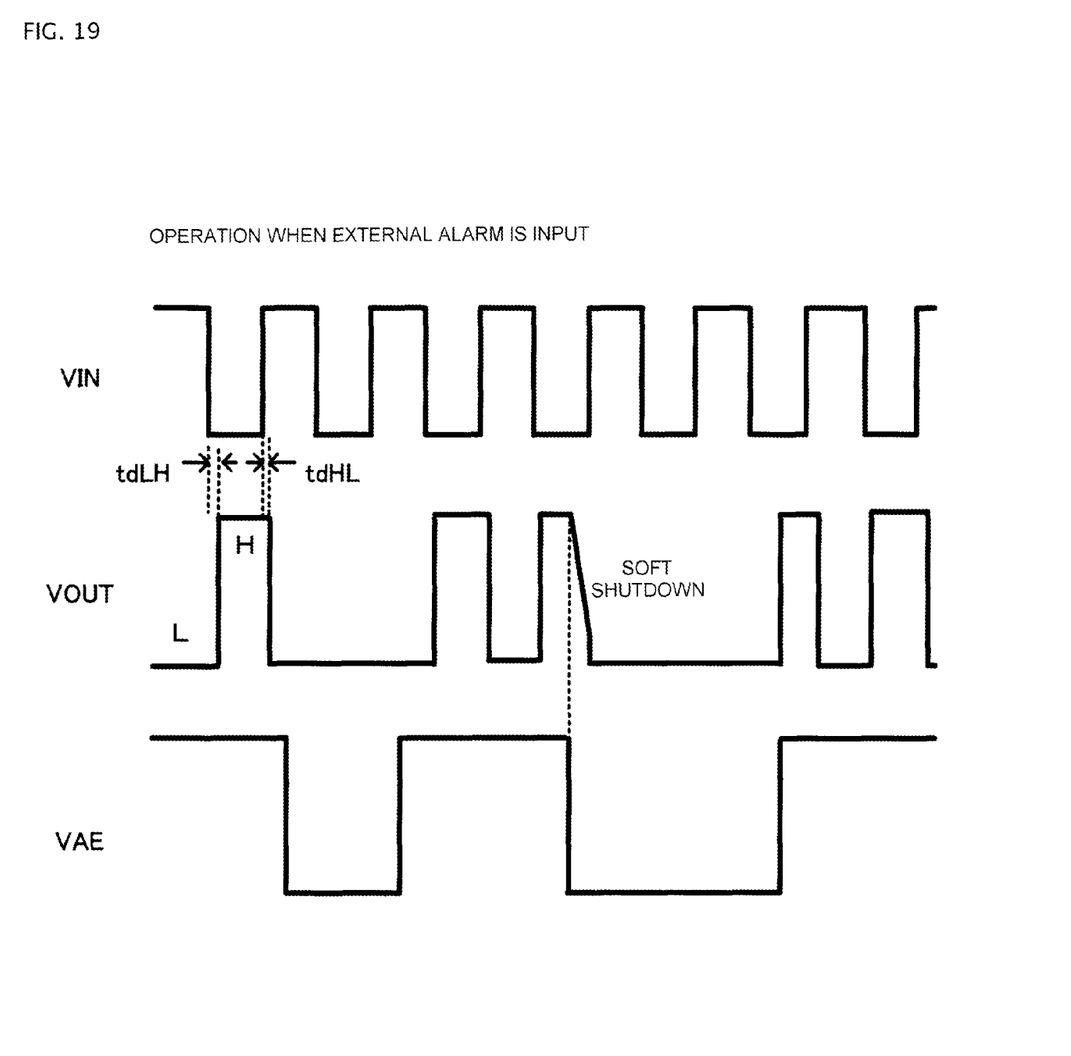
FIG. 19 is a timing chart diagram of an operation when an external alarm is input.

(3) Operation when External Alarm is Input (FIG. 19)

When an L level (alarm condition) signal is input into the alarm terminal AE from the exterior, the output terminal OUT signal changes to a soft shutdown (OFF) signal. When an H level (non-alarm condition) signal is input into the alarm terminal AE from the exterior, the output terminal OUT signal changes back to an H level (ON) signal.

Also, soft shutdown technologies being shown in Patent Documents 1 to 5, technologies whereby the gate voltage is lowered in accordance with the output of a CR time constant circuit are disclosed in Patent Documents 1 to 3. Technologies whereby the gate voltage is lowered by changing the voltage dividing value of the resistor are disclosed in Patent Documents 4 and 5.

RELATED ART DOCUMENTS

Patent Documents

Patent Document 1: JP-A-5-219752
Patent Document 2: JP-A-6-152353
Patent Document 3: JP-A-2007-104805
Patent Document 4: JP-A-2001-197724
Patent Document 5: JP-A-2006-353093

OUTLINE OF THE INVENTION

Problems that the Invention is to Solve

However, to date, the rating of the IGBT 61, which is the switching element used, has differed for each system, meaning that demands regarding the shutdown characteristics of the shutdown circuit 52 (the voltage-current characteristics of the output terminal OUT and the voltage waveform of the output terminal OUT) differ. Because of this, there is a need to review the design of the p-MOSFET 57 (or an unshown n-MOSFET) configuring the shutdown circuit 52 for each system, and the manufacturing cost of the drive IC 500 increases. The shutdown characteristics are primarily determined by the characteristics of the p-MOSFET. The same applies in the case of an n-MOSFET.

Also, in Patent Documents 1 to 5, no description is given of a semiconductor device (drive IC) with which it is possible to select at will soft shutdown characteristics in accordance with the system.

An object of the invention is to provide a low cost semiconductor device with which it is possible to easily select shutdown characteristics of shutdown circuit appropriate to a system, thus solving the heretofore described problems.

Means for Solving the Problems

In order to achieve the heretofore described object, according to the invention according to claim 1, a semiconductor device having a shutdown circuit that detects an abnormal condition of a switching element and outputs a signal that shuts down the switching element is configured in such a way that the shutdown circuit has a resistor circuit that determines transition characteristics of the signal that shuts down the switching element, the resistor circuit has one or plural circuit elements, and the transition characteristics of the signal that shuts down the switching element is changeable by changing the connection of the one or plural circuit elements.

Also, according to the invention according to claim 2, it is good that the invention according to claim 1 is such that a signal with a gentle fall is selectable in order to shut the switching element down softly.

Also, according to the invention according to claim 3, the invention according to claim 1 is such that the shutdown circuit has a first n-channel type MOSFET and the resistor circuit serially connected to the first n-channel type MOSFET.

Also, according to the invention according to claim 4, it is good that the invention according to claim 1 is such that the resistor circuit is configured of a non-linear element and a linear element, and that one or both thereof is selectable.

Also, according to the invention according to claim 5, the invention according to claim 4 is such that the non-linear element is a second n-channel type MOSFET whose gate and drain are connected, or one or plural serially connected p-n diodes, and the linear element is a resistor or short circuit wiring.

Also, according to the invention according to claim 6, it is good that the invention according to claim 4 or claim 5 is such that the plural non-linear elements are provided, and that any one thereof is selectable.

Also, according to the invention according to claim 7, it is good that the invention according to claim 1 or claim 4 is such that a change in the connection of the circuit elements configuring the resistor circuit is carried out using a switching conductor.

Also, according to the invention according to claim 8, it is good that the invention according to claim 7 is such that the switching conductor is a bonding wire of aluminum, gold, copper, or aluminum wiring or polysilicon wiring patterned on a semiconductor substrate.

Advantage of the Invention

According to the invention, simply by changing the connection condition of the switching conductor (bonding wire, aluminum wiring, or polysilicon wiring) for the non-linear elements and linear element configuring the resistor circuit, it is possible to easily obtain soft shutdown characteristics suited to the switching element (IGBT) configuring any kind of system.

It not being necessary to newly prepare an optimum drive IC every time in order to obtain soft shutdown characteristics suited to any kind of system, it is possible to obtain soft shutdown characteristics suited to the switching element configuring any kind of system simply by changing the connection condition of the switching conductor in the resistor circuit of the same drive IC, meaning that it is possible to reduce the manufacturing cost of the drive IC.

The heretofore described and other objects, characteristics, and advantages of the invention will be made clear by the attached drawings and related following description representing an embodiment preferred as an example of the invention.

MODES FOR CARRYING OUT THE INVENTION

An embodiment will be described with the following working examples.

WORKING EXAMPLE 1

Figure 1:
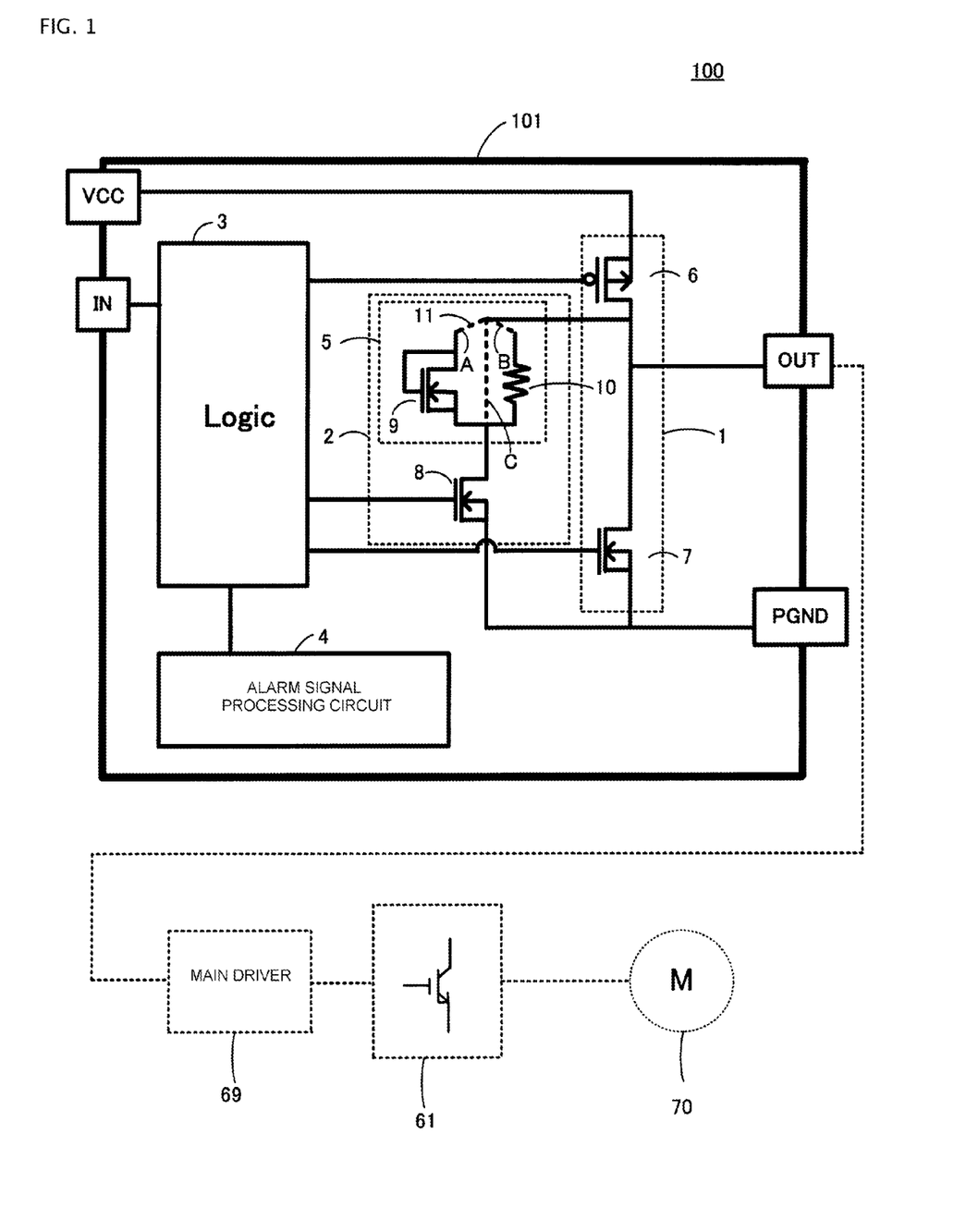
FIG. 1 is a main portion configuration diagram of a semiconductor device of a first working example of the invention.

FIG. 1 is a main portion configuration diagram of a semiconductor device of a first working example of the invention.

The semiconductor device is a drive IC 100 that drives an IGBT 61 (n-channel type) controlling a motor 70.

The drive IC 100 is configured of an output stage circuit 1, a shutdown circuit 2, a logic circuit 3, and an alarm signal processing circuit 4, and these circuits are formed in a semiconductor substrate 101.

The output stage circuit 1 is configured of a p-MOSFET 6, whose source is connected to a power source terminal VCC, and an n-MOSFET 7, whose drain is connected to the drain of the p-MOSFET 6 and whose source is connected to a ground terminal PGND.

Also, the shutdown circuit 2 is configured of a resistor circuit 5 and an n-MOSFET 8, wherein the resistor circuit 5 is formed of an n-MOSFET 9, a resistor 10 and a switching conductor 11. The n-MOSFET 9 is diode connected, and has V-I (voltage-current) characteristics similar to those of a diode. Also, the resistor circuit 5 becomes the n-MOSFET 9 when switching the switching conductor 11 to an A condition, becomes the resistor 10 when switching to a B condition, and takes on a short-circuited condition when switching to a C condition. In the C condition, the switching conductor 11 becomes a short circuit conductor.

The gate and drain of the n-MOSFET 9 are connected, forming a non-linear element. The n-MOSFET 9 may be replaced with one unshown p-n diode, or plural thereof connected in series. Also, the resistor 10 is shown here as a linear element. Furthermore, herein, short circuit wiring (the C condition) is also included in the linear element. Also, the switching conductor is a bonding wire of aluminum, gold, or copper, or aluminum wiring, polysilicon wiring, or the like, patterned on a semiconductor substrate.

A signal from an output terminal OUT of the drive IC 100 is input into a main driver 69 that drives the IGBT 61, and a signal from the main driver 69 is input into the gate of the IGBT 61. The IGBT 61, being a motor controlling element, controls the motor 70. There is also a case wherein the main driver 69 is omitted, and the signal from the output terminal OUT is input directly into the gate of the IGBT 61.

In the drive IC 100, a normal operation signal is input into an input terminal IN at a time of normal operation, and a gate signal is applied to the p-MOSFET 6 and n-MOSFET 7 of the output stage circuit 1 via the logic circuit 3. An on-off signal is transmitted to the gate of the IGBT from the output terminal OUT, and the IGBT 61 carries out a normal operation. The main driver 69, in the same way as the one in FIG. 12, functions as one kind of current amplifier that amplifies the action of an input portion, thus drawing a charge accumulated at the gate of the IGBT 61.

Figure 2:
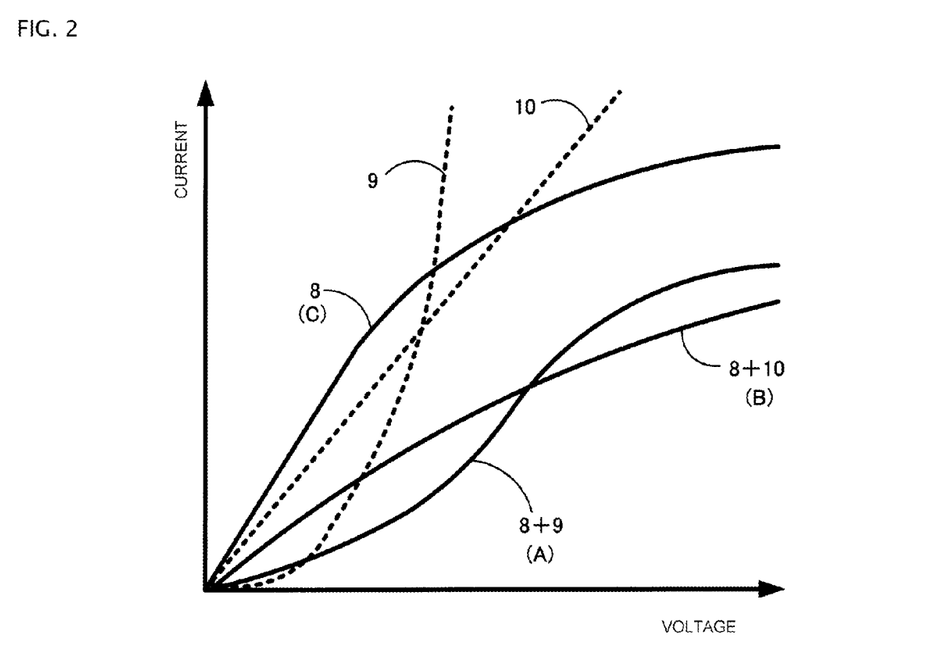
FIG. 2 is a diagram showing voltage-current characteristics of an output terminal OUT.

FIG. 2 is a diagram showing voltage-current characteristics of the output terminal OUT. In FIG. 2, voltage-current characteristics of the n-MOSFET 9 and resistor are also shown together. The voltage-current characteristics of the n-MOSFET 9 are similar to the forward direction characteristics of a diode. When the switching conductor 11 is in the A condition, the voltage-current characteristics are those when the n-MOSFET 8 and n-MOSFET 9 are serially connected. When the switching conductor 11 is in the B condition, the voltage-current characteristics are those when the n-MOSFET 8 and resistor 10 are serially connected. Also, when the switching conductor 11 is in the C condition, the voltage-current characteristics are those of the n-MOSFET 8.

By switching the switching conductor 11, it is possible to easily change the voltage-current characteristics of the output terminal OUT.

Figure 3:
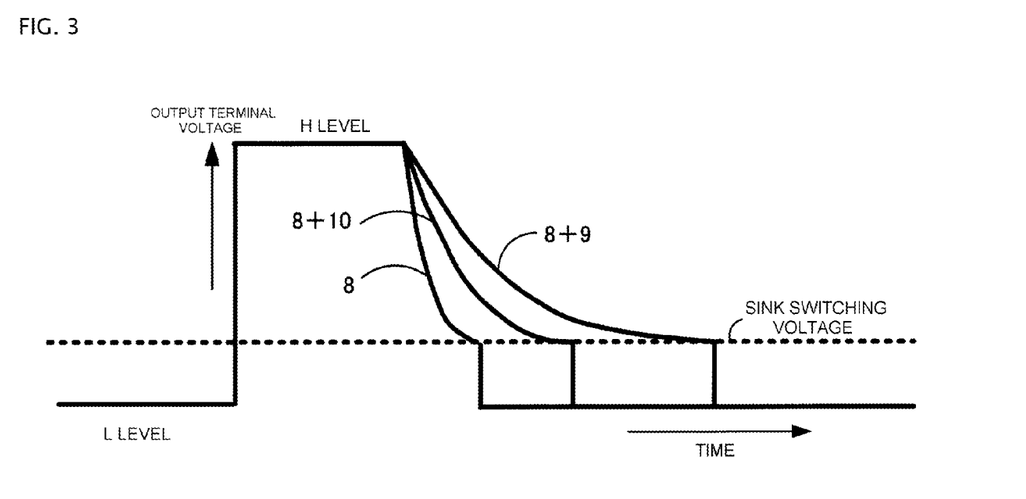
FIG. 3 is an output terminal OUT voltage waveform diagram.

FIG. 3 is an output terminal OUT voltage waveform diagram. As shown in FIG. 3, by switching the switching conductor 11, it is possible to easily change the falling waveform of the voltage when the voltage of the output terminal OUT changes from an H level to an L level. The gentler the falling waveform, the softer the shutdown of the IGBT 61, and the more possible it is to prevent destruction of the IGBT 61.

In response to abnormal operations such as overvoltage or overheat, the charge accumulated at the gate of the IGBT 61 is drawn via the main driver 69 and n-MOSFET 8 by the p-MOSFET 6 and n-MOSFET 7 being turned off, and the n-MOSFET 8 being turned on, via the alarm signal processing circuit 4 and logic circuit 3 (to be exact, when using the main driver 69, the shutdown circuit 2 draws current from the input portion of the main driver 69, and the main driver 69 amplifies the action of the input portion, thus drawing the charge accumulated at the gate of the IGBT 61, in the same way as in FIG. 12). At this time, by drawing the accumulated charge gently by selecting the condition of the switching conductor 11 so that the drop in the voltage of the output terminal OUT is gentle, it is possible to cause a soft shutdown of the IGBT 61. However, when the fall of the voltage of the output terminal OUT is too gentle, there occurs a problem such as the turn-off loss of the IGBT 61 increasing, meaning that it is necessary to select the connection condition of the switching conductor 11 in such a way as to configure a resistor circuit 5 suited to the IGBT 61.

Also, at a stage at which the voltage of the output terminal OUT becomes sufficiently low (a sink switching voltage), the n-MOSFET 7 of the output stage circuit 1 is turned on, and the IGBT 61 is turned off.

Simply by selecting the connection condition (A, B, or C) of the switching conductor 11, it is possible to change the shutdown characteristics of the shutdown circuit 2 (the transition characteristics of a signal that shuts down the switching element (IGBT)) at will. Also, by selecting the A or B condition as the connection condition of the switching conductor 11, it is possible to make the shutdown characteristics of the shutdown circuit 2 soft shutdown characteristics.

Heretofore, although an optimum drive IC 100 has been newly selected, or redesigned, to suit a system, according to the invention, it is possible to respond to various kinds of system simply by changing the connection condition of the switching conductor 11 in the resistor circuit 5 of the same drive IC 100. As a result of this, it is possible to reduce the manufacturing cost of the drive IC 100.

Also, as the shutdown circuit 2 is configured using an n-channel type MOSFET (the n-MOSFET 8) that can drive at a low voltage of in the region of 5V, it is no longer necessary, as heretofore done, to provide a gate signal that can vary between 0V and a battery VB voltage for the shutdown circuit 2.

Also, as the area occupied by the MOSFET 9 and resistor 10 configuring the shutdown circuit 2 is small, and it is possible for the n-type MOSFET 8 to be smaller than a heretofore known p-type MOSFET 47, they do not become factors in a cost increase, and it is possible to reduce the cost in comparison with that of a shutdown circuit 57 using the heretofore known p-type MOSFET 47.

WORKING EXAMPLE 2

Figure 4:
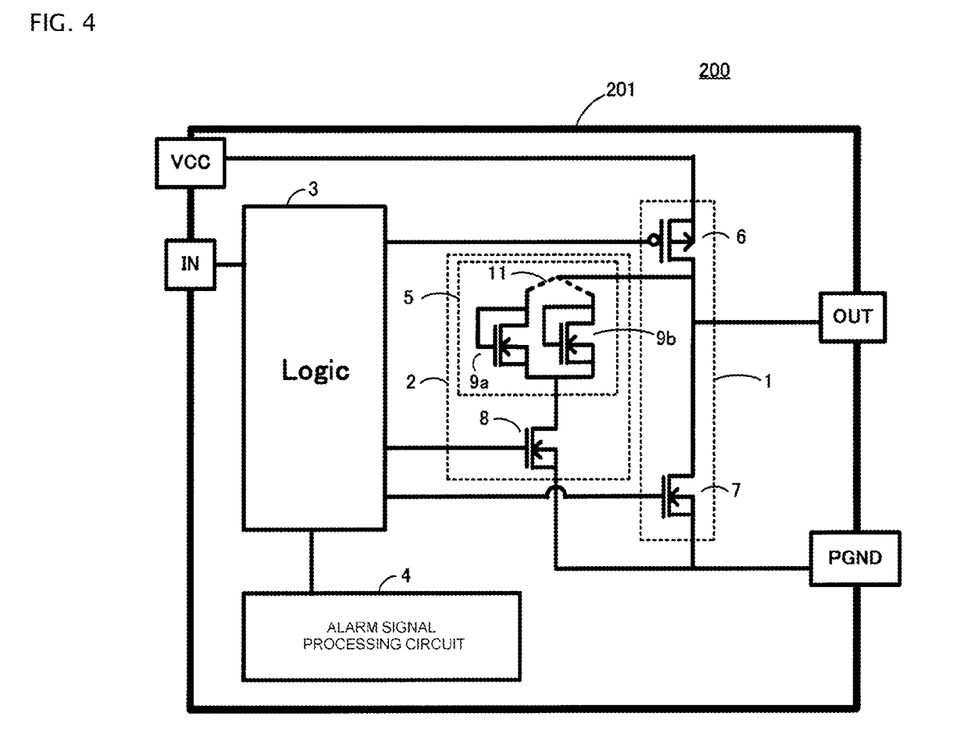
FIG. 4 is a main portion configuration diagram of a semiconductor device of a second working example of the invention.

FIG. 4 is a main portion configuration diagram of a semiconductor device of a second working example of the invention. The semiconductor device is a drive IC 200 that drives the IGBT 61 controlling the motor 70. Each circuit is formed in a semiconductor substrate 201.

A difference from FIG. 1 is that the resistor circuit 5 is configured of plural n-MOSFETs, which are switched between using the switching conductor 11. Herein, although a case of two n-MOSFETs, an n-MOSFET 9a and an n-MOSFET 9b, is shown, a large number may be further provided.

Figure 5:
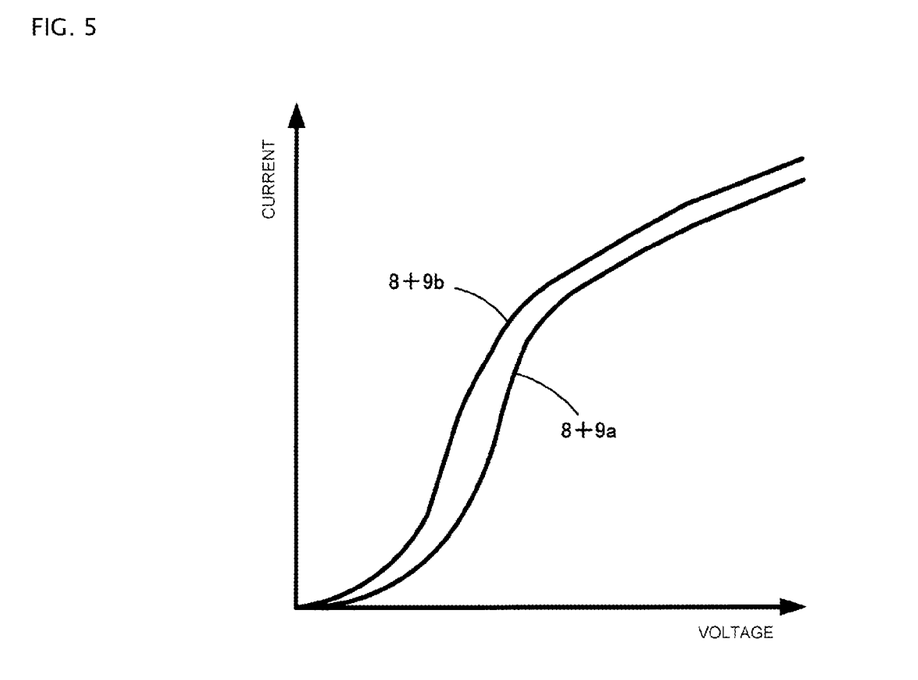
FIG. 5 is a diagram showing voltage-current characteristics of the output terminal OUT.
Figure 6:
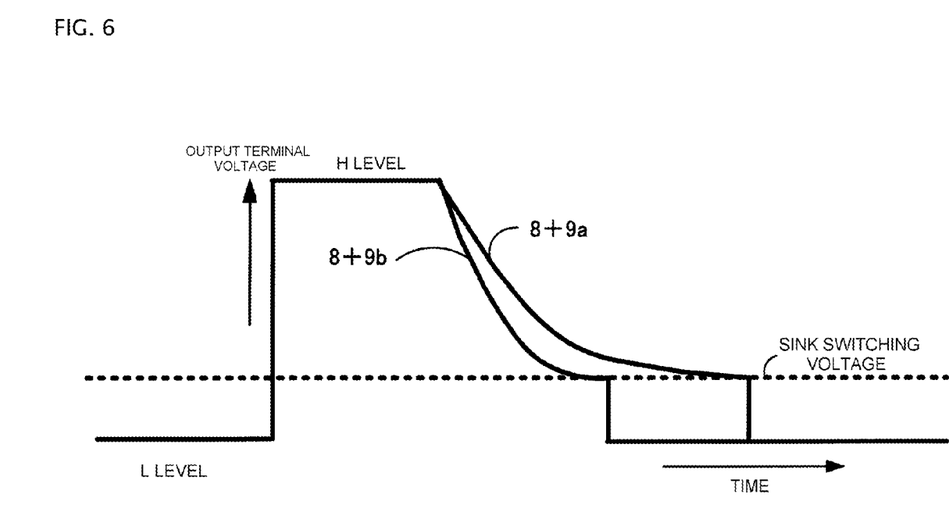
FIG. 6 is an output terminal OUT voltage waveform diagram.

FIG. 5 is a diagram showing voltage-current characteristics of the output terminal OUT. Switching between the n-MOSFETs 9a and 9b is carried out by changing the connection condition of the switching conductor 11, and it is possible to adopt an optimum condition wherein a soft shutdown of the IGBT 61 is possible by changing the fall characteristics (the transition characteristics of a signal that shuts down the switching element (IGBT)) of the voltage of the output terminal OUT, as shown in FIG. 6. As it is sufficient to change the connection condition of the switching conductor 11, the switching can be easily carried out.

WORKING EXAMPLE 3

Figure 7:
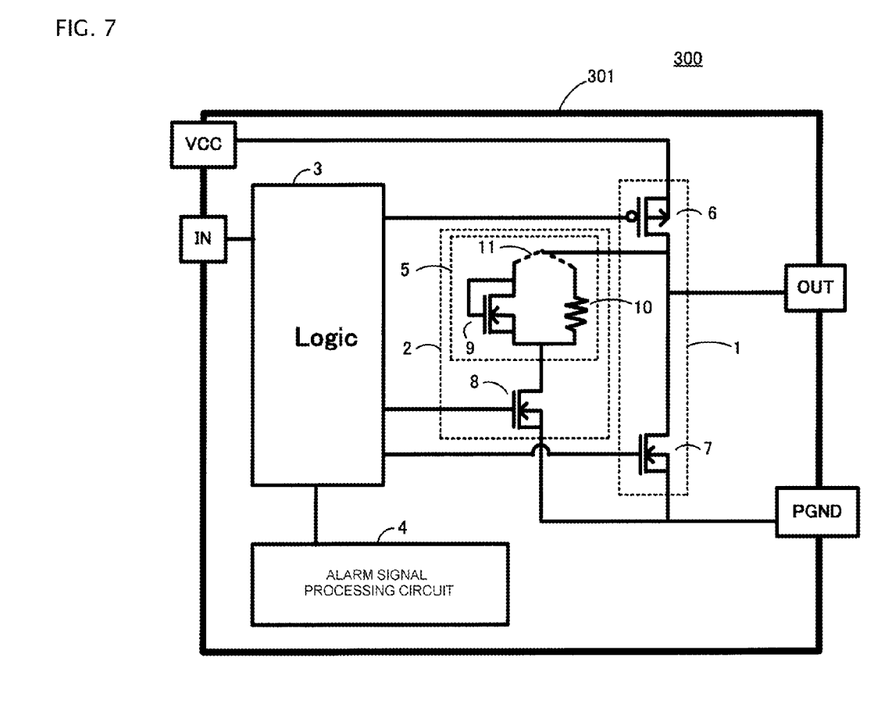
FIG. 7 is a main portion configuration diagram of a semiconductor device of a third working example of the invention.

FIG. 7 is a main portion configuration diagram of a semiconductor device of a third working example of the invention. The semiconductor device is a drive IC 300 that drives the IGBT 61 controlling the motor 70. Each circuit is formed in a semiconductor substrate 301.

A difference from FIG. 1 is that the n-MOSFET 9 and resistor 10 configuring the resistor circuit 5 are connected in parallel by the switching conductor 11.

Figure 8:
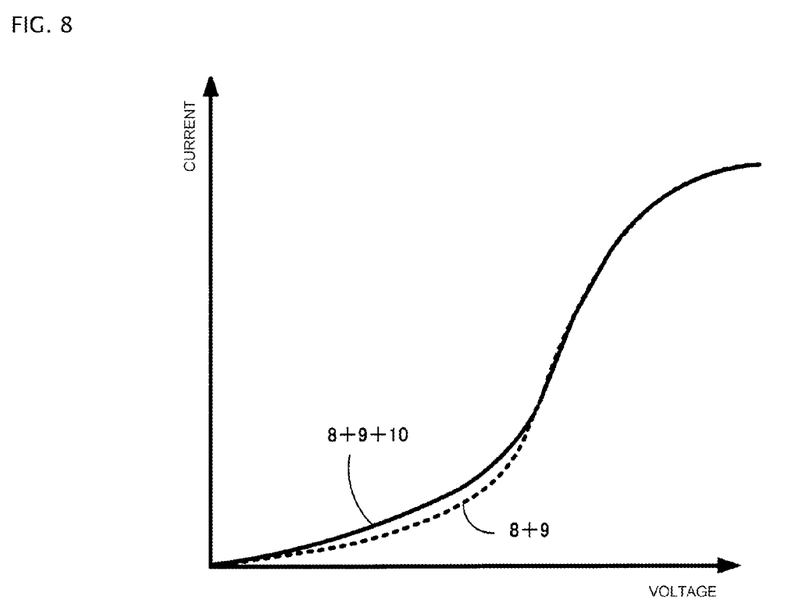
FIG. 8 is a diagram showing voltage-current characteristics of the output terminal OUT.
Figure 9:
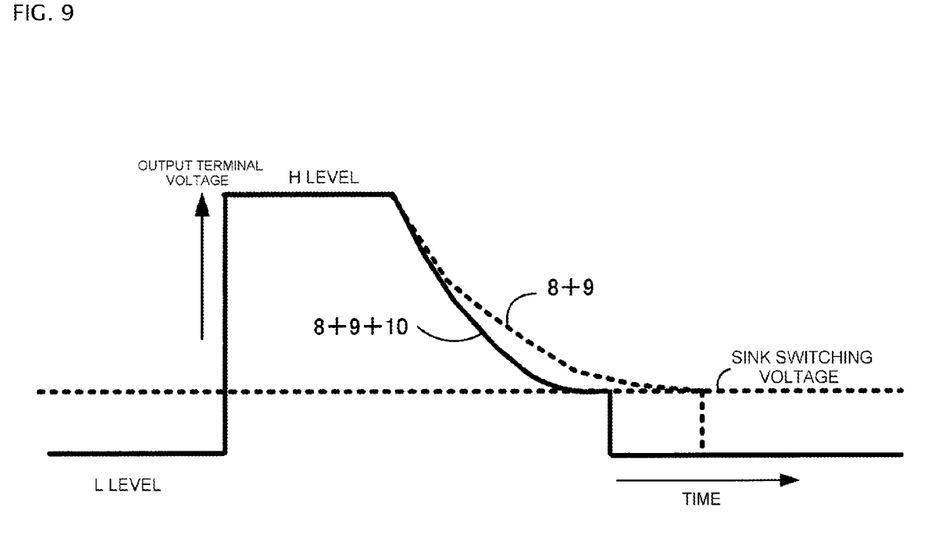
FIG. 9 is an output terminal OUT voltage waveform diagram.

FIG. 8 is a diagram showing voltage-current characteristics of the output terminal OUT. The voltage-current characteristics change in a way such that the current in a region of low voltage increases in comparison with a case of the n-MOSFET 9 alone. In this way, by combining the n-MOSFET 9 and resistor 10 using the switching conductor 11 too, it is possible to change the fall characteristics (the transition characteristics of a signal that shuts down the switching element (IGBT)) of the voltage of the output terminal OUT, as shown in FIG. 9.

As previously described, by forming plural n-MOSFETs and a resistor in advance as the resistor circuit 5, and carrying out the connection thereof using the switching conductor 11, it is possible to easily adopt a resistor circuit 5 suited to the IGBT configuring the system. Also, as it is possible to respond to various kinds of system with the same drive IC, it is possible to achieve a reduction in manufacturing cost.

In FIG. 7, although a case is shown wherein one each of the n-MOSFET 9 and resistor 10 are formed, plural each may be formed, and a combination thereof selected so that soft shutdown characteristics suited to the system are obtained.

Also, in Working Examples 1 and 3, an arrangement may be such that the resistance value of the resistor 10 can be selected by the resistor 10 being configured of plural series resistors, and the switching conductor 11 being connectable to any connection point among the series resistors.

The description heretofore shows merely the principle of the invention. Furthermore, a large number of modifications and changes being possible to those skilled in the art, the invention is not limited to the accurate configurations and applications shown and described heretofore, and all corresponding modification examples and equivalents are seen as the range of the invention according to the attached claims and equivalents thereof.

Description of Reference Numerals and Signs
1 Output stage circuit
2 Shutdown circuit
3 Logic circuit
4 Alarm signal processing circuit
5 Resistor circuit
6 p-MOSFET (output stage circuit)
7 n-MOSFET (output stage circuit)
8 n-MOSFET (shutdown circuit)
9, 9a, 9b n-MOSFET (source and drain connection, resistor circuit)
10 Resistor
11 Switching conductor (bonding wire or the like)
61 IGBT (n-channel type)
69 Main driver
70 Motor
100, 200, 300 Drive IC
101, 201, 301 Semiconductor substrate

The invention claimed is:

1. A semiconductor device having a shutdown circuit that detects an abnormal condition of a switching element and outputs a signal that shuts down the switching element, the semiconductor device being characterized in that
    the shutdown circuit has a resistor circuit that determines transition characteristics of the signal that shuts down the switching element,
    the resistor circuit has one or a plurality of circuit elements, and
    the transition characteristics of the signal that shuts down the switching element is changeable by changing the connection of the one or plurality of circuit elements.

2. The semiconductor device according to claim 1, characterized in that a signal with a gentle fall is selectable in order to shut the switching element down softly.

3. The semiconductor device according to claim 1, characterized in that the shutdown circuit has a first n-channel type MOSFET and the resistor circuit serially connected to the first n-channel type MOSFET.

4. The semiconductor device according to claim 1, characterized in that the resistor circuit is configured of a non-linear element and a linear element, and that one or both thereof is selectable.

5. The semiconductor device according to claim 4, characterized in that the non-linear element is a second n-channel type MOSFET whose gate and drain are connected, or one or a plurality of serially connected p-n diodes, and the linear element is a resistor or short circuit wiring.

6. The semiconductor device according to claim 4, characterized in that a plurality of the non-linear elements are provided, and that any one thereof is selectable.

7. The semiconductor device according to claim 1, characterized in that a change in the connection of the circuit elements configuring the resistor circuit is carried out using a switching conductor.

8. The semiconductor device according to claim 7, characterized in that the switching conductor is a bonding wire of aluminum, gold, copper, or aluminum wiring or polysilicon wiring patterned on a semiconductor substrate.

9. The semiconductor device according to claim 5, characterized in that a plurality of the non-linear elements are provided, and that any one thereof is selectable.

10. The semiconductor device according to claim 4, characterized in that a change in the connection of the circuit elements configuring the resistor circuit is carried out using a switching conductor.

* * * * *